United States Patent
Gasquet et al.

(10) Patent No.: US 6,821,143 B2
(45) Date of Patent: Nov. 23, 2004

(54) DEVICE SUPPORTING A LIGHT-EMITTING DIODE FOR AN AUTOMOBILE SIGNALLING SYSTEM, AND A METHOD OF MANUFACTURING SUCH A DEVICE

(75) Inventors: Jean-Claude Gasquet, Bobigny Cedex (FR); Alcina Tanghe, Bobigny Cedex (FR)

(73) Assignee: Valeo Vision, Bobigny (FR)

( * ) Notice: Subject to any disclaimer, the term of this patent is extended or adjusted under 35 U.S.C. 154(b) by 0 days.

(21) Appl. No.: 10/446,342

(22) Filed: May 27, 2003

(65) Prior Publication Data

US 2004/0029436 A1 Feb. 12, 2004

(30) Foreign Application Priority Data

May 27, 2002 (FR) .............................................. 0206458

(51) Int. Cl.⁷ .............................................. H01R 13/00
(52) U.S. Cl. ...................................................... 439/485
(58) Field of Search ........................ 439/485, 486–587, 439/695, 945, 75; 362/294, 547; 361/700, 719; 257/715

(56) References Cited

U.S. PATENT DOCUMENTS

| | | | | |
|---|---|---|---|---|
| 4,183,400 A | * | 1/1980 | Seifert ................... | 165/104.29 |
| 5,177,666 A | * | 1/1993 | Bland et al. ................ | 361/689 |
| 5,343,358 A | * | 8/1994 | Hilbrink ..................... | 361/700 |
| 5,946,191 A | * | 8/1999 | Oyamada .................... | 361/700 |
| 2001/0030866 A1 | | 10/2001 | Hochstein | |

FOREIGN PATENT DOCUMENTS

| EP | 1 139 019 A1 | 4/2001 |
|---|---|---|
| WO | 00/55685 | 11/2000 |

OTHER PUBLICATIONS

Annex French Search Report, Dated Jun. 2, 2003.

* cited by examiner

*Primary Examiner*—J. F. Duverne
(74) *Attorney, Agent, or Firm*—Morgan & Finnegan LLP

(57) ABSTRACT

The object of the invention is a device supporting a power light-emitting diode for an automobile signalling or lighting system, comprising an insulating support and means of electrical connection to the electrodes of the diode. The electrical connection means comprise, on the insulating support, electrical connection lugs; the body of the light emitting diode is fixed to an area of a heat-radiating element; this heat-radiating element is attached to the insulating support, and the electrodes of the diode are insulated from the heat-radiating element and electrically connected to the connecting lugs of the insulating support by tongues insulated from the radiating element after the breakage of temporary fasteners.

18 Claims, 3 Drawing Sheets

DEVICE SUPPORTING A LIGHT-EMITTING DIODE FOR AN AUTOMOBILE SIGNALLING SYSTEM, AND A METHOD OF MANUFACTURING SUCH A DEVICE

The invention relates to a device supporting a light-emitting diode (LED) for an automobile signalling or lighting system, comprising an insulating support, in particular made from plastics material, and means of connection to the electrodes of the light-emitting diode.

Use is already made, for signalling, of low-power light-emitting diodes. In order to obtain a sufficient light flux, for example of at least 30 lumens, and to fulfil a signalling function, several diodes are combined. The heat produced within each low-power diode is discharged in a satisfactory manner by the electrodes providing the electrical connection. Good heat dissipation is in fact necessary since the light efficiency of a light-emitting diode decreases if its junction temperature increases.

The progress made makes it possible now to obtain power light-emitting diodes whose light flux exceeds 30 lumens. The heat release by the power diode is great and cannot be discharged in a satisfactory manner by the electrodes. A power diode is thus generally provided with a base for establishing effective thermal contact with a heat dissipation means.

A single power light-emitting diode could fulfil an automobile signalling function, for example a stop light or side light, but its installation poses a problem, in particular with the heat dissipation.

In the electronics industry power light-emitting diodes are used. For mounting them use is generally made of a circuit known by the term "MCPCB" (Metal Core Printed Circuit Board), which corresponds to a solution resulting from techniques used in electronics. The circuit is rigid, and serves as a physical support, electrical conductor and heat dissipater.

Such a solution is too costly for the automobile sector and cannot be suitable. In addition, its compatibility with automobile signalling techniques is not satisfactory.

The aim of the invention is in particular to optimise the use of power light-emitting diodes for producing automobile signalling and lighting systems at a sufficiently low cost price to be acceptable. An optimisation of this type entails an effective extraction of the heat produced by the diode in order to optimise the performance with regard to the usable light flux.

According to the invention, a device supporting a power light-emitting diode for an automobile signalling or lighting system comprises an insulating support, in particular made from plastics material, and means of electrical connection to the diode electrodes, and is characterised by the fact that the electrical connection means comprise, on the insulating support, electrical connection lugs, the fact that the body of the light-emitting diode is fixed to an area of a heat-radiating element, the fact that this heat-radiating element is attached to the insulating support, and the fact that the electrodes of the diode are insulated from the heat-radiating element and electrically connected to the connection lugs of the insulating support.

The heat-radiating element preferably comprises, on its contour, at least one scallop in the direction of the light-emitting diode fixing area, at least one of the diode electrodes is disposed in a corresponding scallop in the radiating element, and the electrical connection means comprise, in the scallop or in each scallop, a tongue made from electrically conductive material whose edges are distant from those of the scallop and whose external radial end is situated in the vicinity of or beyond the external contour of the radiating element.

The invention makes it possible to provide, effectively, an automobile signalling function, for example a stop or side light, with a single power light-emitting diode.

The invention exploits a synergy between a purely electronic technique and a specific technique of the automobile signalling sector. The result is an optimisation of costs, the maintenance of compatibility with the methods used for conventional light sources, and the maintenance of basic qualities of signalling devices already existing.

The support device according to the invention constitutes a specialised terminal for a power light-emitting diode, making it possible to preserve the specificity of a terminal for a conventional lamp. The terminal forms an interface between an electronic board and the light-emitting diode via a connection system.

The power light-emitting diode can produce a light flux of at least 30 lumens, in particular at least 40 lumens.

The radiating element can be obtained from a sheet of metal which is a good conductor of heat and electricity, in particular a sheet of copper, with a relatively low thickness, for example less than 1 mm. The rigidity, when the device is mounted, is provided by the connection to the insulating support.

The fixing area for the base of the light-emitting diode preferably consists of the central area of the radiating element, which comprises two opposite scallops starting from its contour and directed towards the central area; each electrode of the diode is situated respectively in a scallop, and an electrically conductive tongue is situated in each scallop and is connected to the corresponding electrode, the edges of the tongue being distant from those of the scallop.

The tongue advantageously consists of a cut-out part of the sheet or plate forming a radiator, in correspondence with a scallop.

In such a support device, the thermal function of discharge of the heat by the radiating element is separate from the electrical conduction function provided by the tongues disposed in the scallops and electrically insulated from the radiator.

The edge of the tongue remote from the light-emitting diode can project beyond the contour of the radiating element in order to facilitate electrical connection.

The assembly of the radiating element and insulating support can be provided by cooperation of holes provided in the radiating element and pins, studs or rivets provided on the insulating support.

The diode electrodes can be spot welded, in particular by laser.

The invention also relates to a method of manufacturing a support device as defined above, this method being characterised by the fact that there are prepared separately an insulating support, in particular made from plastics material, provided with electrical connection lugs, and a radiating assembly comprising a power light-emitting diode, and that the radiator and insulating support are assembled mechanically whilst providing the electrical connection of the diode electrodes with the connecting lugs.

Advantageously, the radiating assembly is produced from a sheet or plate of metal which conducts heat and electricity, in particular copper, from which there are partially cut, on each side of a central area, tongues which remain temporarily connected by fasteners with a reduced cross-section, forming shunts, to the major part of the sheet or plate in order to ensure its coherence and mechanical holding; the light-emitting diode is positioned and fixed, in particular by adhesive bonding, to the central area of the radiating element; each diode electrode is welded with a respective tongue and the connecting shunts between tongues and radiating element are next broken so as to provide the electrical insulation of each tongue vis-à-vis the radiating element.

The connecting shunts between a tongue and the radiating element have sufficient cross-section to provide mechanical holding, but relatively small so as to limit the discharge of heat through the shunts when the electrodes are welded to the tongues.

With its two opposite scallops the radiating element has substantially an H shape with broad legs.

The invention consists, apart from the arrangements disclosed above, of a certain number of other arrangements which will be dealt with more explicitly below with regard to example embodiments described in detail with reference to the accompanying drawings, but which are in no way limiting.

Figure 9:
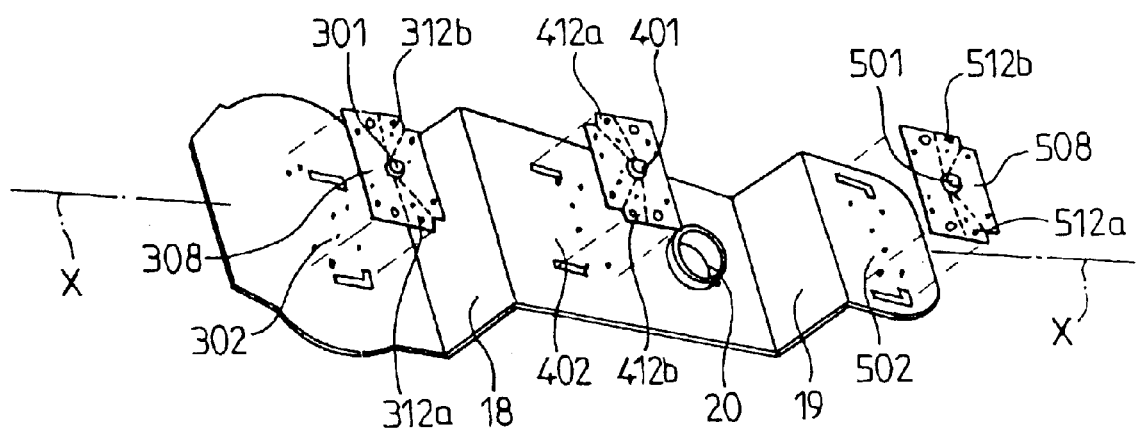

FIG. 9, finally, is a perspective view of a support for a rear signalling system of a vehicle.

Figure 3:
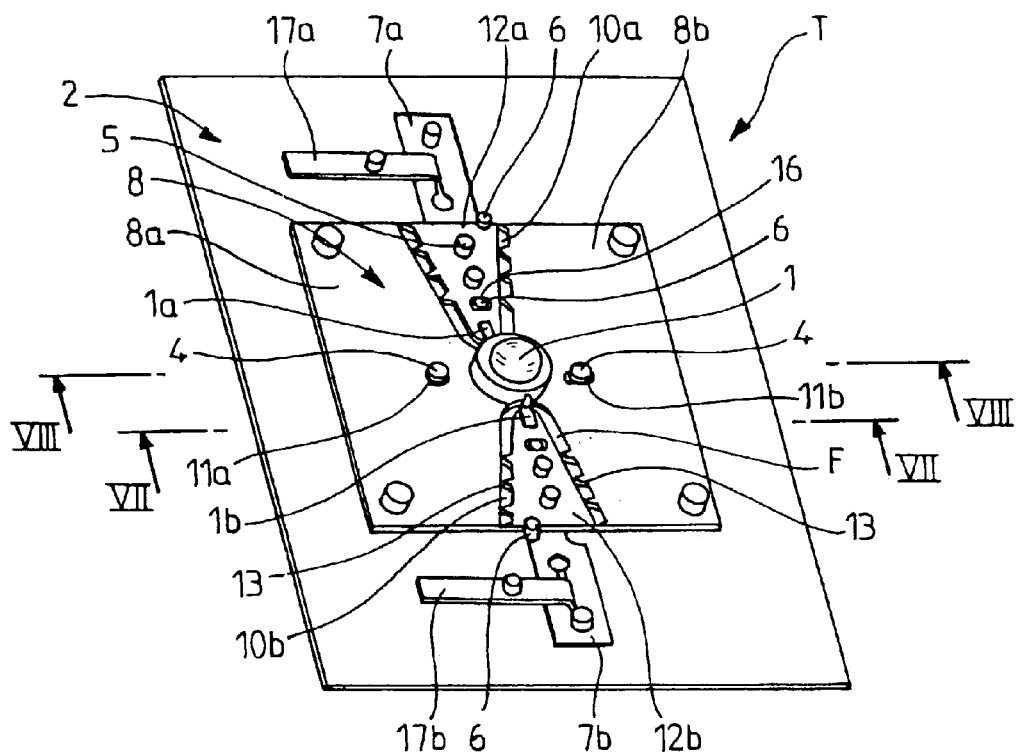
FIG. 3 shows in perspective the radiating element and the diode of FIG. 2 connected to the support of FIG. 1.

Referring to FIG. 3 of the drawings, a support device T can be seen, or specialised terminal, for a power light-emitting diode 1, that is to say a diode which can provide a light flux of at least 30 lumens, and preferably 40 lumens or more. In the remainder of the description the usual acronym "LED" will be used to designate a light-emitting diode.

The service life of an LED, in particular a power LED, is high. The light efficiency of an LED also being high, the use of power LEDs for motor vehicle signalling or lighting systems becomes particularly advantageous.

The support device T comprises an insulating support consisting, in the example depicted, of a rectangular rigid plate 2 (FIG. 1) made from electrically insulating plastics material. The support illustrated is flat, but it could have a surface which is curved, or stepped as in FIG. 9. The insulating support constitutes a base made from plastics material corresponding to a lighting source-holder device of a signalling light.

The plate 2 comprises pins, studs or rivets 3, 4, 5 and 6 (FIG. 1) projecting on its surface. The pins 5 form two groups, symmetrical relative to the centre of the plate 2, and aligned along the mid-perpendicular of the small sides of the plate 2.

Figure 1:
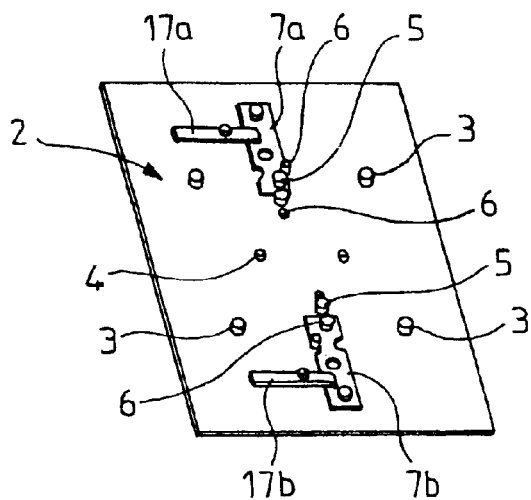
FIG. 1 is a schematic perspective view of a plastic insulating support for a device according to the invention.
Figure 2:
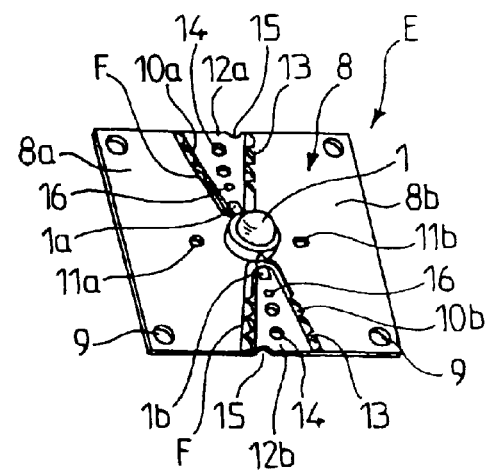
FIG. 2 is a perspective view of a power light-emitting diode installed on a radiating element, whilst the electrical connection tongues are still connected by shunts to the heat radiator.

Two electrical supply lugs 7a, 7b are housed in the thickness of the plate 2 so that the top surface of the lugs 7a, 7b is flush with the top surface of the plate 2. The lugs 7a, 7b are produced from a metal which is a good conductor of electricity, for example copper. The lugs are separated from each other and, according to FIGS. 1 and 2, are aligned along the mid-perpendicular of the small sides of the plate 2. The lugs 7a, 7b are fixed to the plate 2 by cooperation of holes provided in the lugs 7a, 7b and pins 5.

The pins 3, 4, 5, 6 are designed to position and irreversibly fix a sub-assembly E (FIG. 2) formed by a radiating element 8 to which the LED 1 is fixed.

The radiating element 8 consists of a metallic material which has a high coefficient of thermal conduction for extracting the heat emitted by the LED 1 and which is also a good electrical conductor. This material can be copper with a tin-plated protection or based on nickel or nickel alloy of the NiCr type for example. However, it is also possible to use aluminium if the need to extract heat is less great, or copper alloys providing correct thermal conduction with self-protection vis-à-vis the environment. The radiating element 8 is preferably obtained from a metallic sheet of lesser thickness, in particular less than 1 mm, with low rigidity. However, the element 8 can also be obtained from a thicker metallic plate.

Figure 7:
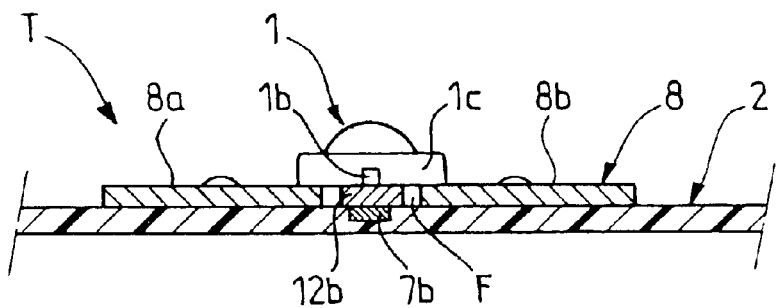
FIG. 7 is a schematic section, to a larger scale, along the line VII—VII in FIG. 3, with external parts.
Figure 8:
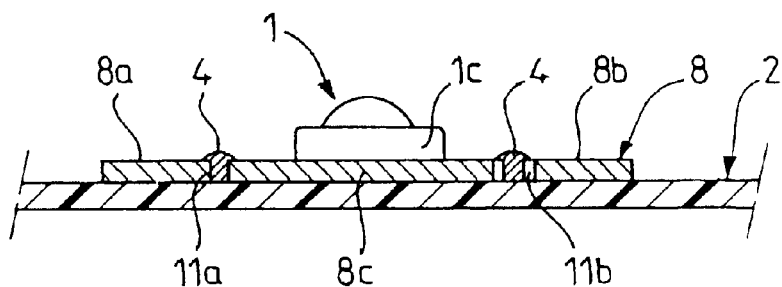
FIG. 8 is a schematic section, similar to FIG. 7, along the line VII—VII in FIG. 3.

The body 1c of the LED is in contact, through its entire base (see FIGS. 7 and 8) with the radiating element 8. The body 1c is fixed to this element 8, for example by adhesive bonding. The transmission of heat between the body 1a and the element 8 takes place effectively, through the layer of adhesive, over the entire surface of the base of the body 1c.

The element 8, according to the example depicted, is rectangular and, towards each of its vertices, comprises a hole 9 able to cooperate with one of the four pins 3 on the support 2 for fixing. The element 8 has a shape adapted to that of the support 2.

The radiating element 8 comprises, on its contour, two opposing scallops 10a, 10b, substantially in the form of a V with a rounded apex, turning their concavity towards the outside and preferably symmetrical with respect to the mid-perpendicular of the non-scalloped sides of the element 8. The element 8 has substantially the shape of an H whose two legs 8a, 8b are greatly broadened. The LED 1 is fixed to the central area 8c which provides the connection between the legs 8a and 8b. The surface of the legs 8a and 8b is large and the heat transmitted by the base of the LED 1 to the area 8c can be dissipated effectively.

The electrodes, anode and cathode, 1a, 1b of the diode 1 are placed in line with the scallops 10a, 10b and are not in contact with the legs 8a, 8b.

The positioning of the radiating element 8 on the support 2 is provided by means of a circular hole 11a provided in the leg 8a in order to cooperate with a pin 4 on the support 2, and an oblong hole 11b in the leg 8b in order to cooperate, whilst allowing a tolerance, with another pin 4.

The electrical connection means of the LED 1 comprise, in each scallop 10a, 10b, a respective tongue 12a, 12b made from electrically conductive material. When the device is finished, the edges of the tongues 12a, 12b are separated from those of the corresponding scallop by a continuous slot F providing electrical insulation. In FIG. 3, the support device is not totally finished, and fasteners or connecting shunts 3 temporarily remain between the edges of the tongues 12a and 12b and the edges of the scallops.

The electrodes 1a, 1b of the LED are connected respectively to the corresponding tongue 12a, 12b by welding, preferably by laser welding. The tongues comprise holes 14 designed to cooperate with corresponding pins 5 on the support 2 and provide the mechanical fixing of the tongues to the support 2. The external edge of each tongue 12a, 12b comprises a recess 15, for example semicircular, able to cooperate with a pin 6 on the support 2 in order to provide the centring of the tongue 12a, 12b. Each tongue also comprises an oblong hole 16 able to cooperate, whilst allowing a tolerance, with another pin 6.

The whole is designed so that, when the radiating element 8 is positioned on the support 2, the external areas of the tongues 12a, 12b come to bear on areas of the lugs 7a, 7b situated radially towards the centre. One or more pins 5 can pass through superimposed holes provided respectively in the lugs 5 and the tongues 12a or 12b so that the fixing by crushing of the head of the pin 5 effectively applies the tongue 12a or 12b against the corresponding lug 7a, 7b and thus establishes good electrical contact. The lugs 7a, 7b are sandwiched between the support 2 and the tongues 12a, 12b.

The areas of the lugs 7a, 7b situated outside the contour of the radiating element 8 are connected to lugs 17a, 17b which provide the electrical supply from conductors, not shown.

The tongues 12a, 12b are advantageously cut from the same metallic sheet or plate as the radiating element 8 so that, in producing the tongues 12a, 12b, the scallops 10a, 10b are also produced.

During manufacture, a scoring of a sheet or plate of conductive material is first of all carried out as illustrated in FIGS. 2 and 3. In accordance with this scoring, the tongues 12a, 12b remain adjoining the edge of the scallops 10a, 10b through the connecting shunts 13.

The shunts 13 are provided in sufficient number and cross-section to ensure the mechanical holding of the tongues 12a, 12b and the coherence of the radiator 8 during handling and fixing to the support 2. However, the cross-sections of the shunts 13 are sufficiently reduced to restrict diffusion of heat from the tongues 12a, 12b to the radiating elements 8 when the electrodes 1a, 1b are welded to the tongues 12a, 12b. Laser welding is advantageous since the addition of heat takes place in a reduced time, which avoids loss of heat by conduction, prejudicial to the quality of the welding.

After having scored the radiator 8 with the tongues 12a, 12b and the shunts 13, the base of the LED 1 is adhesively bonded to the central area 8c of the radiator. After bonding of the LED 8, the electrodes 1a, 1b are welded to the tongues 12a, 12b, still mechanically adjoining the radiating element 8 through the shunts 13.

The subassembly E thus formed is positioned and irreversibly fixed to the support 2. The heads of the various pins, which pass through the holes in the radiator 8 and the tongues 12a, 12b project above the radiator and tongues. These heads are crushed by conventional methods, for example by simple thermal effect, by ultrasound or by heating by laser ray.

The last step of the method consists of mechanically breaking the shunts 13 in order to provide continuity of the slot 5 and the electrical insulation of the tongues 12a, 12b vis-à-vis the radiator 8. The breakage of the shunts 13, illustrated in FIG. 4, can be obtained by any suitable means, for example by pressing in a tool. The indentations resulting from the scoring tool assist this operation.

The power LED support device thus obtained is economical and uses a support 2 which can suit either a power LED or a conventional lamp.

Figure 5:
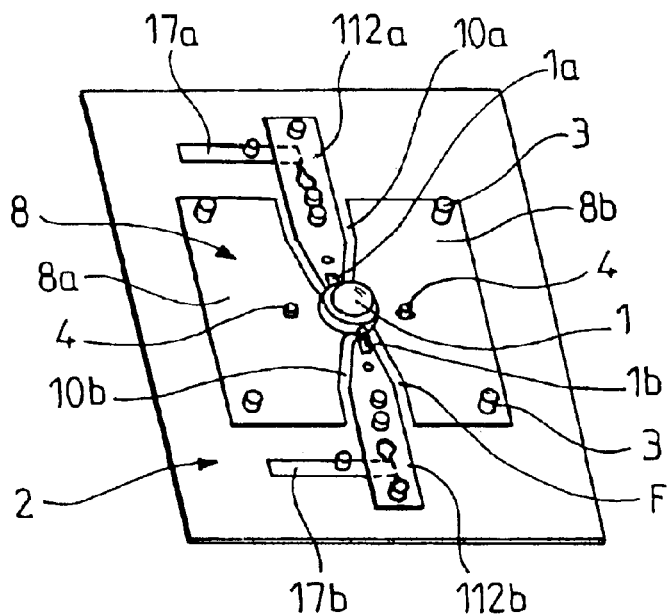
FIG. 5 shows in perspective, to a smaller scale, a variant embodiment of FIG. 3.

FIG. 5 shows a variant embodiment according to which the conductive tongues 112a, 112b housed in the scallops 10a, 10b project, in the mean direction of the scallops, beyond the external contour of the radiating element 8. This makes it possible to establish a direct electrical connection with the lugs 17a, 17b and to omit the supply lugs 7a, 7b provided in FIGS. 1 and 3. The lugs 17a, 17b are preferably housed in the thickness of the plate 2 so that the top surface of the lugs 17a, 17b is flush with the top surface of the plate 2. The tongues 112a, 112b cover a part of the lugs 17a, 17b in order to establish contact.

Figure 4:
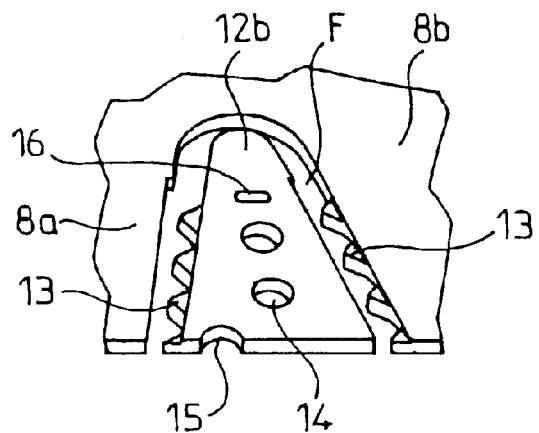
FIG. 4 shows in perspective, to a larger scale, with cut-away parts, an electrical connection tongue separated mechanically from the edges of the scallop in which it is housed.

The tongues 112a, 112b can be cut from the same sheet of conductive metal as the radiating element 8. The areas of the tongues 112a, 112b situated in the scallops 10a, 10b are simply scored initially as in FIGS. 2 and 3 and remain adjoining the edge of the scallops 10a, 10b through shunts similar to 13. After welding of the electrodes of the LED 1 to the tongues 112a, 112b and after fixing the radiator 8 and the tongues on the support 2, the connecting shunts are broken as illustrated in FIG. 4.

This variant makes it possible to secure the quality of the connections obtained. The assembly sequence is also simplified.

Figure 6:
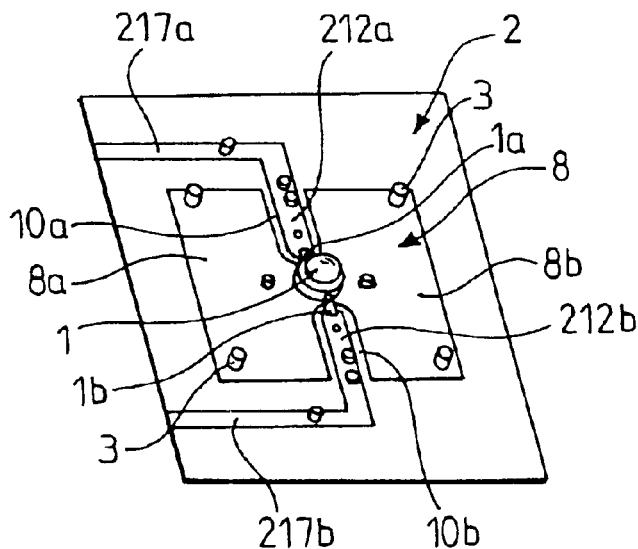
FIG. 6 shows, similarly to FIG. 5, another variant embodiment.

FIG. 6 shows another variant embodiment according to which the conductive tongues 212a, 212b housed in the scallops 10a, 10b are in a single piece with the respective supply lugs 217a, 217b. Each tongue 212a, 212b, with the corresponding lug 217a, 217b, forms a right-angled bracket fixed to the support 2. One leg of the right-angled bracket, forming the tongue 212a, 212b, is engaged in the scallop 10a, 10b over a sufficient distance to make it possible to weld an electrode of the LED 1 to the end of this tongue. The tongues project out of the scallops 10a, 10b so that the lugs 217a, 217b are sufficiently distant from the contour of the radiating element 8.

This variant requires optimisation in the choice of material used for producing the assembly consisting of a tongue 212a, 212b and a lug 217a, 217b. The assembly sequence is further simplified with respect to the solution of FIG. 5.

FIG. 9 shows in perspective an example embodiment according to the invention for rear signalling on a vehicle. The insulating support in a single piece made from plastics material comprises three plates 302, 402, 502, situated in offset parallel planes and connected by inclined walls 18, 19 substantially orthogonal to the plates. The mean direction X—X of the support, when it is installed on the vehicle, is horizontal, perpendicular to the longitudinal axis of the vehicle; the plates 302, 402, 502 are situated in vertical planes, parallel to the longitudinal axis of the vehicle. The dimension of the support in a direction orthogonal to the axis X—X progressively increases from the plate 502, situated towards the outside of the vehicle, to the plate 302 closer to the longitudinal axis of the vehicle.

Each plate 302, 402, 502 is equipped with studs similar to the studs 3, 4, 5, 6 in FIGS. 1 and 3, and electrical supply lugs similar to the lugs 17a, 17b in FIGS. 1 and 3, in order to receive respectively a radiating element 308, 408, 508 on which an LED 301, 401, 501 is installed. Scallops with scored tongues 312a, 312b, 412a, 412b, 512a, 512b are provided in each radiating element. The tongues on one and the same radiating element have their median lines oriented along two successive half-diagonals and project in a corner of the external contour of the radiating element in order to come into contact with a lug on the corresponding plate. Each subassembly formed by a radiating element, an LED and the tongues is similar to that in FIG. 2, and is fixed to the corresponding plate of the support as described previously. The shunts connecting the tongues to the radiating element are broken after fixing of the element 308, 408, 508 to the insulating support.

The power LEDs 301, 401, 501 fulfil respectively a different function, for example a stop light, side light or direction indicator light, and are controlled accordingly.

The intermediate plate 402, more extensive than the other two in the direction X—X, comprises, close to the wall 19, a hole 20 for fitting a conventional light source for a reversing light.

Whatever the variant embodiment, the invention makes it possible to have a choice of materials with regard to the radiator carrying the LED, and to promote heat exchanges in effecting the mechanical and electrical connection.

What is claimed is:

1. A device supporting a power light-emitting diode for an automobile signalling or lighting system, comprising an insulating support, and means of electrical connection to the diode electrodes, wherein the electrical connection means comprise, on the insulating support, electrical connection lugs; the body of the light-emitting diode is fixed to an area of a heat-radiating element; this heat-radiating element is attached to the insulating support, and the electrodes of the diode are insulated from the heat-radiating element and electrically connected to the connection lugs of the insulating support.

2. A device according to claim 1, wherein the heat radiating element comprises, on its contour, at least one scallop in the direction of the light-emitting diode fixing area, that at least one of the diode electrodes is disposed in a corresponding scallop in the radiating element, and wherein the electrical connection means comprise, in the scallop or in each scallop, a tongue made from electrically conductive material whose edges are distant from those of the scallop and whose external radial end is situated in the vicinity or beyond the external contour of the radiating element.

3. A device according to claim 1, wherein the power light-emitting diode can produce a light flux of at least 30 lumens.

4. A device according to claim 1, wherein the fixing area for the base of the light-emitting diode consists of the central area of the radiating element, which comprises two opposite scallops starting from its contour and directed towards the central area, each electrode of the diode being situated respectively in a scallop, and an electrically conductive tongue being situated in each scallop and being connected to the corresponding electrode, the edges of the tongue being distant from those of the scallop.

5. A device according to claim 2, wherein the tongue consists of a part cut from the sheet or plate forming a radiator, in correspondence with a scallop.

6. A device according to claim 2, wherein the edge of the tongue remote from the light-emitting diode projects beyond the contour of the radiating element.

7. A device according to claim 1, wherein the radiating element and the insulating support are connected by cooperation of holes provided in the radiating element and pins or studs provided on the insulating support.

8. A device according to claim 1, wherein the diode electrodes are spot welded, in particular by laser.

9. A device according to claim 1, wherein the insulating support in a single piece comprises several plates situated in offset parallel planes and connected by inclined walls, each plate being equipped with a power diode fulfilling a given function.

10. A method of manufacturing a support device according to claim 1, wherein there are prepared separately an insulating support, provided with electrical connection lugs, and a radiating assembly comprising a power light-emitting diode, and wherein the radiator and insulating support are assembled mechanically while providing the electrical connection of the diode electrodes with the connecting lugs.

11. A method according to claim 10, wherein the radiating assembly is produced from a sheet of metal which conducts heat and electricity, in particular copper, from which there are partially cut, on each side of a central area, tongues which remain temporarily connected by fasteners with a reduced cross-section, forming shunts, to the major part of the sheet or plate in order to ensure its coherence and mechanical holding; and light-emitting diode is positioned and fixed, in particular by adhesive bonding, to the central area of the radiating element; each diode electrode is welded with a respective tongue and the connecting shunts between tongues and radiating element are next broken so as to provide the electrical insulation of each tongue vis-à-vis the radiating element.

12. A method according to claim 11, wherein the connecting shunts between a tongue and the radiating element have sufficient cross-section to provide mechanical holding, but relatively small so as to limit the discharge of heat through the shunts when the electrodes are welded to the tongues.

13. A device according to claim 2 wherein the power light-emitting diode can produce a light flux of at least 30 lumens.

14. A device according to claim 2, wherein the fixing area for the base of the light-emitting diode consists of the central area of the radiating element, which comprises two opposite scallops starting from its contour and directed towards the central area, each electrode of the diode being situated respectively in a scallop, and an electrically conductive tongue being situated in each scallop and being connected to the corresponding electrode, the edges of the tongue being distant from those of the scallop.

15. A device according to claim 3, wherein the fixing area for the base of the light-emitting diode consists of the central area of the radiating element, which comprises two opposite scallops starting from its contour and directed towards the central area, each electrode of the diode being situated respectively in a scallop, and an electrically conductive tongue being situated in each scallop and being connected to the corresponding electrode, the edges of the tongue being distant from those of the scallop.

16. A device according to claim 4, wherein the tongue consists of a part cut from the sheet or plate forming a radiator, in correspondence with a scallop.

17. A device according to claim 4, wherein the edge of the tongue remote from the light-emitting diode projects beyond the contour of the radiating element.

18. A device according to claim 5, wherein the edge of the tongue remote from the light-emitting diode projects beyond the contour of the radiating element.

* * * * *